United States Patent
Hsiao et al.

(10) Patent No.: US 12,196,323 B2
(45) Date of Patent: Jan. 14, 2025

(54) SEALING MECHANISM

(71) Applicant: Delta Electronics, Inc., Taoyuan (TW)

(72) Inventors: Wei-Kai Hsiao, Taoyuan (TW); Yao-Tsung Lee, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 18/511,624

(22) Filed: Nov. 16, 2023

(65) Prior Publication Data

US 2024/0093786 A1    Mar. 21, 2024

Related U.S. Application Data

(62) Division of application No. 17/474,825, filed on Sep. 14, 2021.

(30) Foreign Application Priority Data

Mar. 31, 2021    (CN) .......................... 202110347252.1

(51) Int. Cl.
*F16J 15/44* (2006.01)
*F16J 15/02* (2006.01)
*H05K 5/06* (2006.01)

(52) U.S. Cl.
CPC ........... *F16J 15/441* (2013.01); *F16J 15/022* (2013.01); *H05K 5/061* (2013.01)

(58) Field of Classification Search
CPC ........ F16J 15/441; F16J 15/022; F16J 15/108; H05K 5/061; H05K 5/062; H05K 5/069
See application file for complete search history.

(56) References Cited

U.S. PATENT DOCUMENTS

| 3,429,424 A | * | 2/1969 | Dow .................... B65D 25/103 |
| | | | 206/327 |
| 4,706,839 A | * | 11/1987 | Spence .................. B65D 45/02 |
| | | | 53/421 |
| 9,949,394 B2 | | 4/2018 | Kamoshida et al. |
| 2013/0120943 A1 | | 5/2013 | Tamura et al. |
| 2014/0374133 A1* | | 12/2014 | Rost ....................... H02G 3/088 |
| | | | 174/50.51 |

FOREIGN PATENT DOCUMENTS

| CN | 107690237 A | 2/2018 |
| CN | 109327991 A | 2/2019 |
| JP | 2015008248 A | 1/2015 |
| TW | 200835083 A | 8/2008 |

OTHER PUBLICATIONS

Office Action mailed Dec. 6, 2021 in TW Application No. 110111710, 6 pages.
Office Action of its parent U.S. Appl. No. 17/474,825 (issued on Dec. 15, 2023).
Office Action of its parent U.S. Appl. No. 17/474,825 dated Apr. 29, 2024.

* cited by examiner

*Primary Examiner* — James N Smalley
(74) *Attorney, Agent, or Firm* — MUNCY, GEISSLER, OLDS & LOWE, P.C.

(57) ABSTRACT

A sealing mechanism is provided, including a housing, a groove, and a sealing element. The housing includes a first member and a second member, and the groove is formed between the first and second members. The sealing element is formed in the groove by Low Pressure Molding (LPM) and surrounds at least one of the first and second members.

5 Claims, 21 Drawing Sheets

SEALING MECHANISM

CROSS REFERENCE TO RELATED APPLICATIONS

This Application is a Divisional of U.S. patent application Ser. No. 17/474,825, filed Sep. 14, 2021 and entitled "SEALING MECHANISM", which claims priority of China Patent Application No. 202110347252.1 filed on Mar. 31, 2021, the entirety of which is incorporated by reference herein.

BACKGROUND OF THE INVENTION

Field of the Invention

The application relates in general to a sealing mechanism, and in particular, to a sealing mechanism that has a sealing element produced by Low Pressure Molding (LPM).

Description of the Related Art

Conventional sealing mechanisms have been applied in various electronic appliances (e.g. battery chargers or power suppliers) to achieve a waterproofing function. The sealing mechanisms may be implemented by applying O-rings or an Ultrasonic Welding process. However, conventional Ultrasonic Welding processes can only be applied to plastic members, and it is difficult to achieve a high level of waterproofing performance. Moreover, conventional O-rings usually need more assembly time and have poor endurance life. Therefore, it has become a challenge to address the aforementioned problems.

BRIEF SUMMARY OF INVENTION

In view of the aforementioned problems, the object of the invention is to provide a sealing mechanism that includes a housing, a groove, and a sealing element. The housing includes a first member and a second member, and the groove is formed between the first and second members. The sealing element is formed in the groove by Low Pressure Molding (LPM) and surrounds at least one of the first and second members.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the sealing mechanism are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

In the following detailed description of the preferred embodiments, reference is made to the accompanying drawings, and in which specific embodiments of which the invention may be practiced are shown by way of illustration. In this regard, directional terminology, such as "top," "bottom," "left," "right," "front," "back," etc., is used with reference to the orientation of the figures being described. The components of the present invention can be positioned in a number of different orientations. As such, the directional terminology is used for the purposes of illustration and is in no way limiting.

Figure 1:
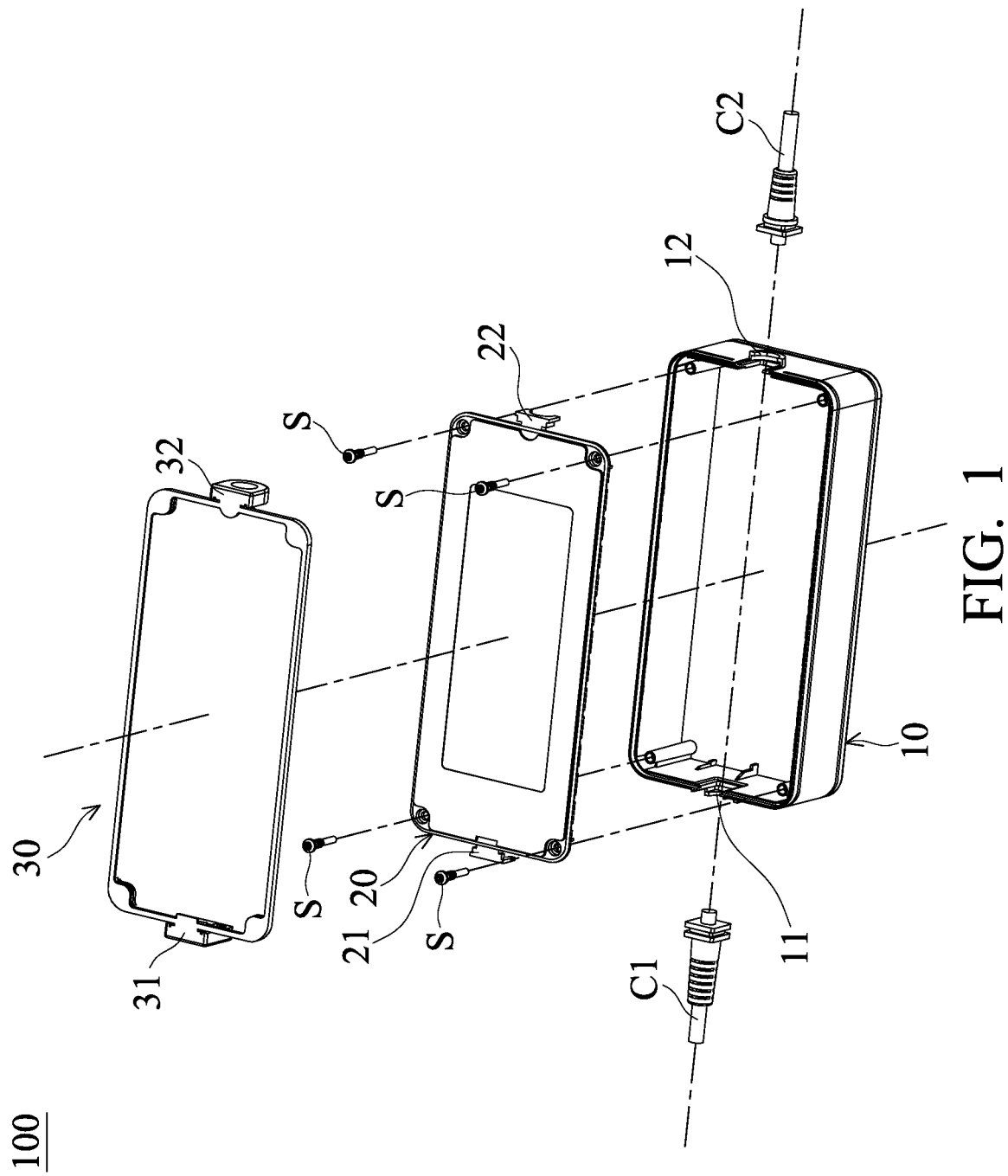
FIG. 1 is an exploded diagram of a sealing mechanism 100 according to an embodiment of the invention.
Figure 2:
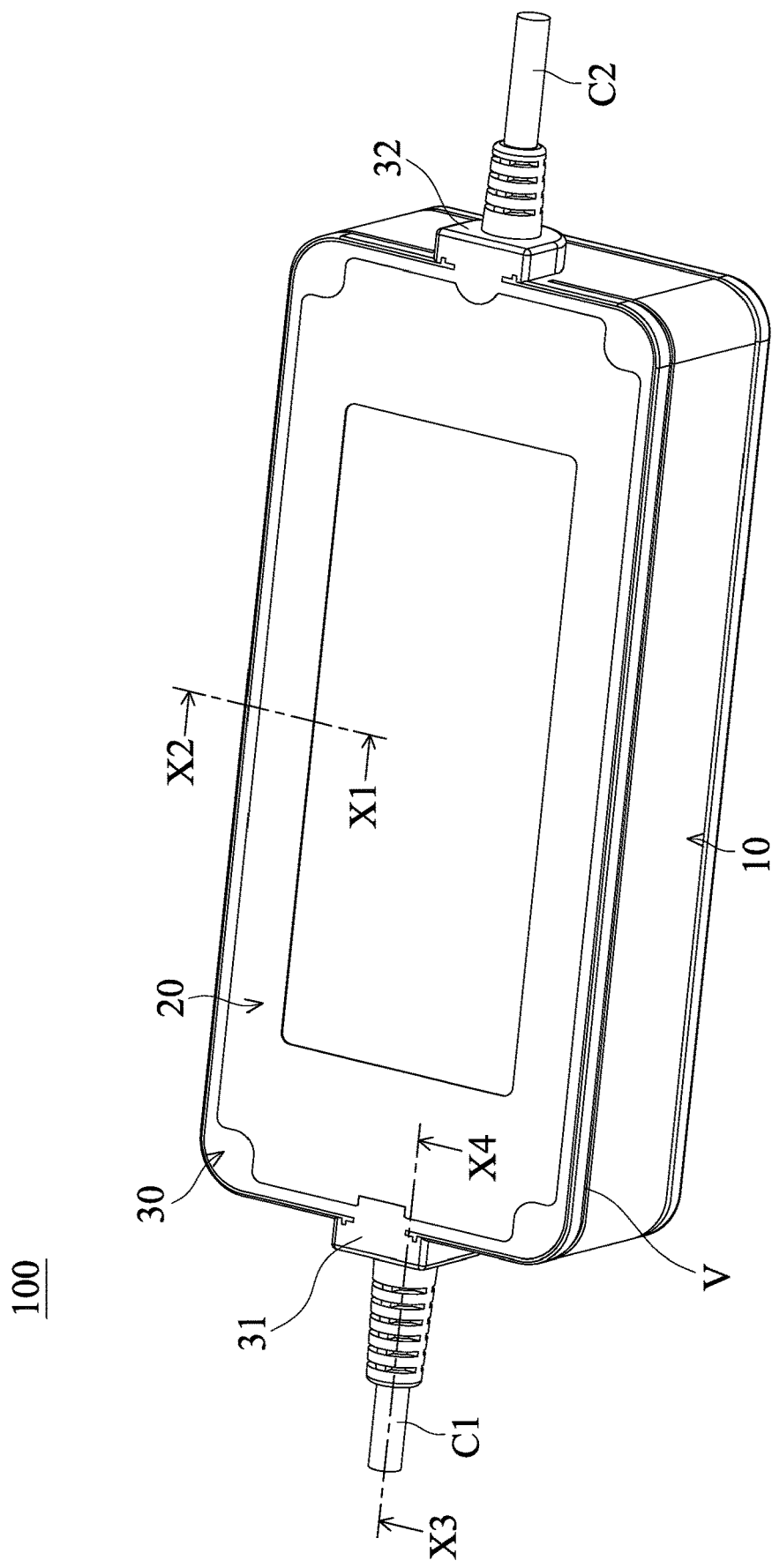
FIG. 2 is a schematic diagram of the sealing mechanism 100 of FIG. 1 after assembly.
Figure 3:
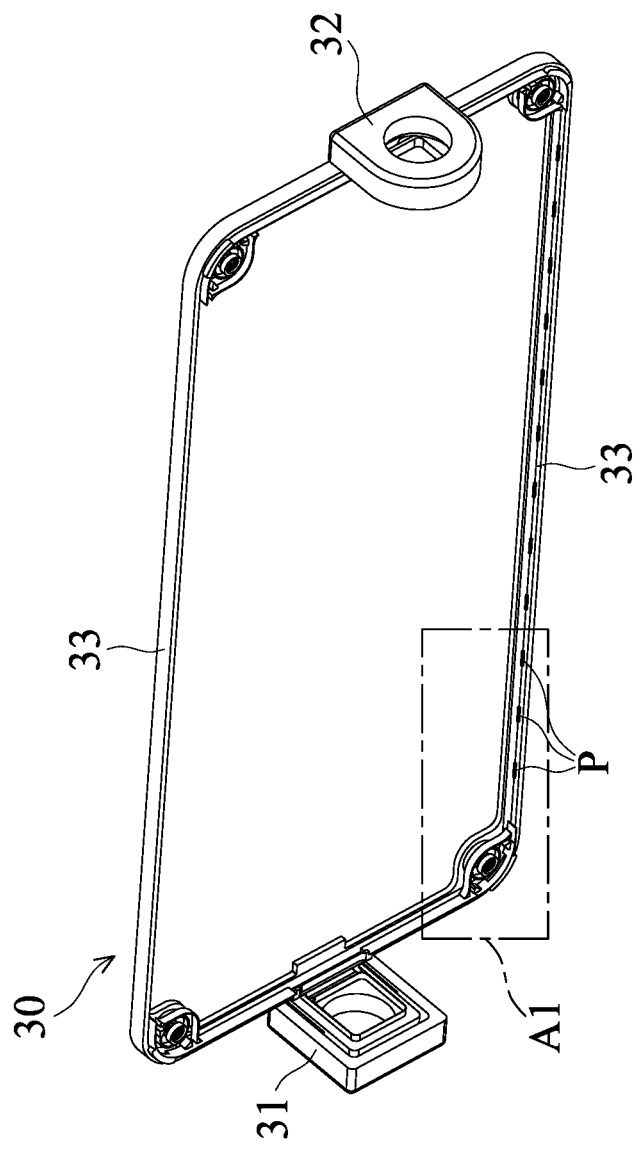
FIG. 3 is a schematic diagram of the sealing element 30 in FIGS. 1 and 2.
Figure 4:
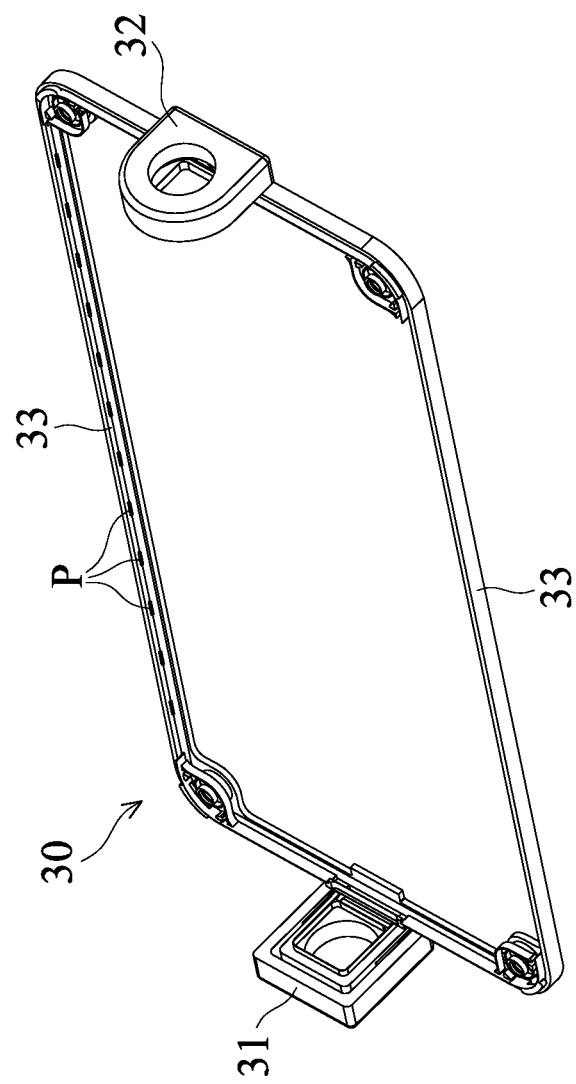
FIG. 4 is another schematic diagram of the sealing element 30 in FIGS. 1 and 2.

FIG. 1 is an exploded diagram of a sealing mechanism 100 according to an embodiment of the invention. FIG. 2 is a schematic diagram of the sealing mechanism 100 of FIG. 1 after assembly. FIG. 3 is a schematic diagram of the sealing element 30 in FIGS. 1 and 2. FIG. 4 is another schematic diagram of the sealing element 30 in FIGS. 1 and 2.

Referring to FIGS. 1-4, an embodiment of the invention provides a sealing mechanism 100 that can be used as a housing of an electronic device (e.g. battery charger or power supply). The sealing mechanism 100 primarily comprises a first member 10, a second member 20, and a sealing element 30. The first and second members 10 and 20 may comprise plastic or metal material, and they can be secured to each other as a housing of an electronic device by several fasteners S (e.g. screws). It should be noted that a groove is formed between the first and second members 10 and 20 after assembly, and the sealing element 30 is formed in the groove by Low Pressure Molding (LPM), so as to prevent water and dust from entering the housing.

In some embodiments, the sealing element 30 may comprise Polyamide (PA) or another thermoplastic material. During assembly of the sealing mechanism 100, the fasteners S (e.g. screws) are inserted through the second member 20 and joined to the first member 10, so that the first and second members 10 and 20 are secured to each other. Subsequently, Polyamide (PA) or another thermoplastic material can be provided in the groove between the first and second members 10 and 20 to form the sealing element 30 by Low Pressure Molding (LPM) process. As shown in FIG. 2, the sealing element 30 surrounds the second member 20 and conceals the fasteners S after assembly of the sealing mechanism 100, whereby the fasteners S would not be exposed to the surface of the sealing mechanism 100, and a waterproof seal can be formed between the first and second members 10 and 20.

Specifically, the first member 10 has a pair of first engaging portions 11 and 12 on opposite sides, and the second member 20 has a pair of second engaging portions 21 and 22 on opposite sides, corresponding to the first engaging portions 11 and 12. Here, a conductive element C1 (e.g. conductive wire) is clamped between the first and second engaging portions 11 and 21, and another conductive element C2 (e.g. conductive wire) is clamped between the first and second engaging portions 11 and 21 after assembly.

Still referring to FIGS. 1-4, the sealing element 30 has a substantially rectangular structure. Two connection portions 31 and 32 are formed on the short sides of the sealing element 30, and two longitudinal extension portions 33 are formed on the long sides of the sealing element 30, wherein the extension portions 33 and connection portions 31 and 32 are connected to each other.

After the sealing element 30 is formed by Low Pressure Molding (LPM), the first engaging portions 11 and 21 are covered by the connection portion 31, and the second engaging portions 12 and 22 are covered by the connection portion 32. Thus, the conductive elements C1 and C2 can be firmly connected to the first second members 10 and 20, and water and dust can be prevented from entering the housing through the gap between the first and second conductive elements C1 and C2 and the first and second members 10 and 20.

Figure 5:
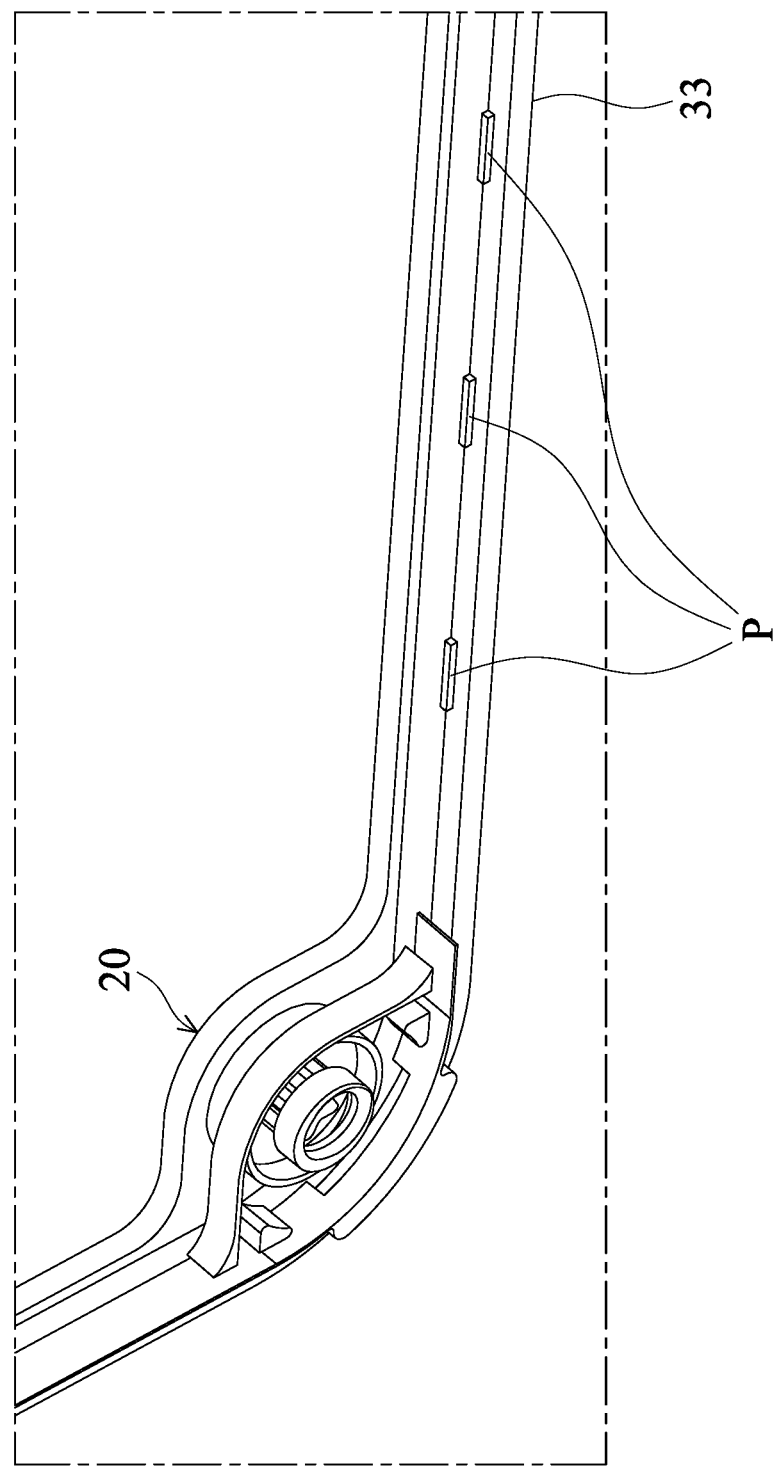
FIG. 5 is an enlarged view of the portion A1 in FIG. 3.
Figure 6:
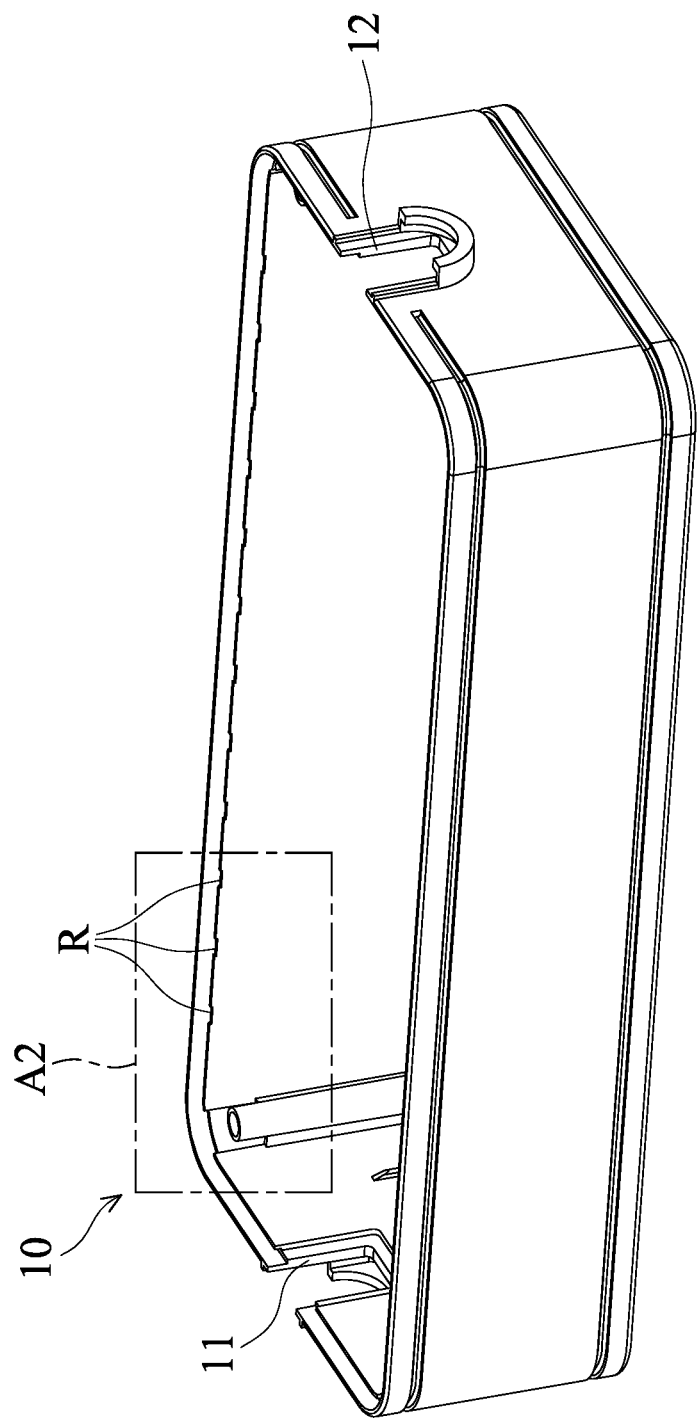
FIG. 6 is a perspective diagram of the first member 10 in FIG. 1.
Figure 7:
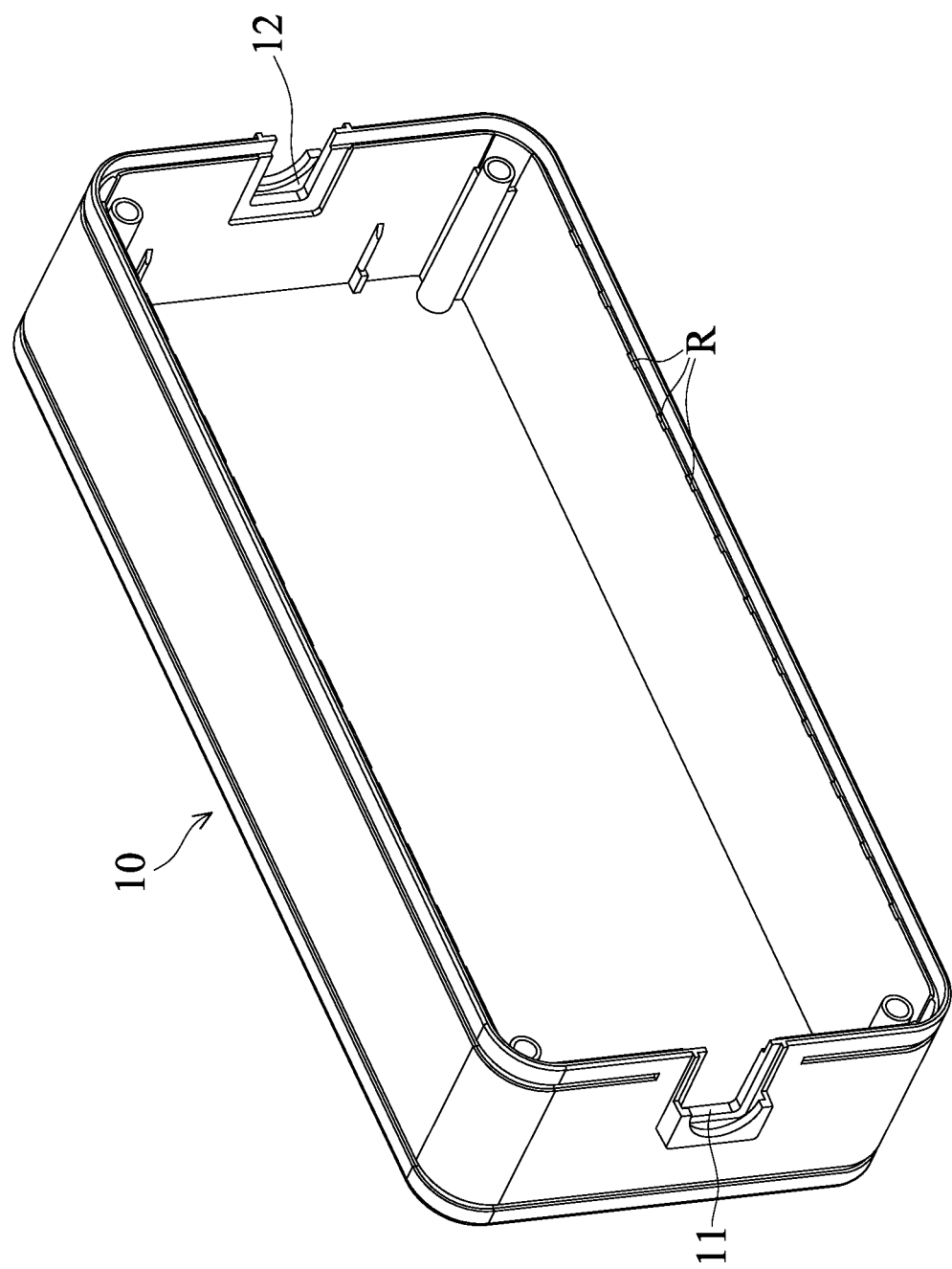
FIG. 7 is another perspective diagram of the first member 10 in FIG. 1.
Figure 8:
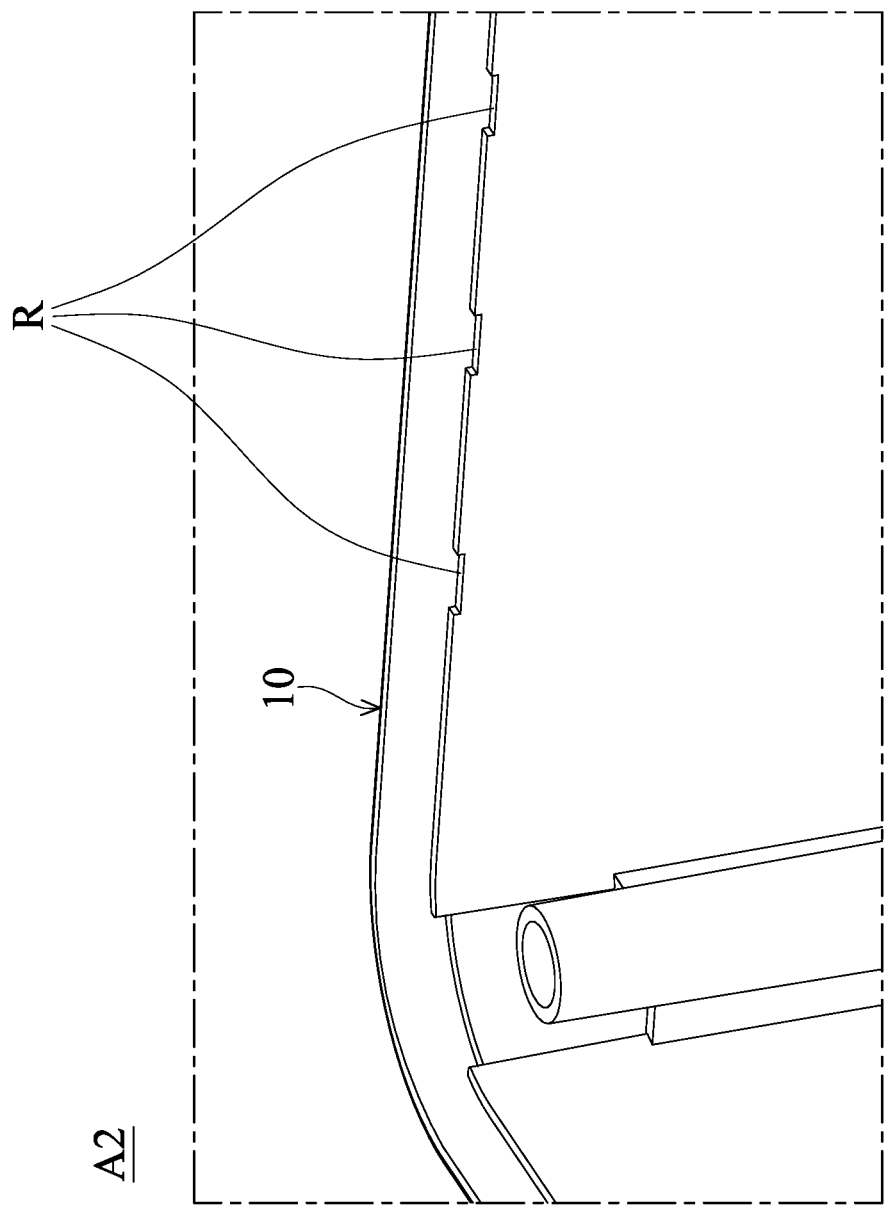
FIG. 8 is an enlarged view of the portion A2 in FIG. 6.
Figure 9:
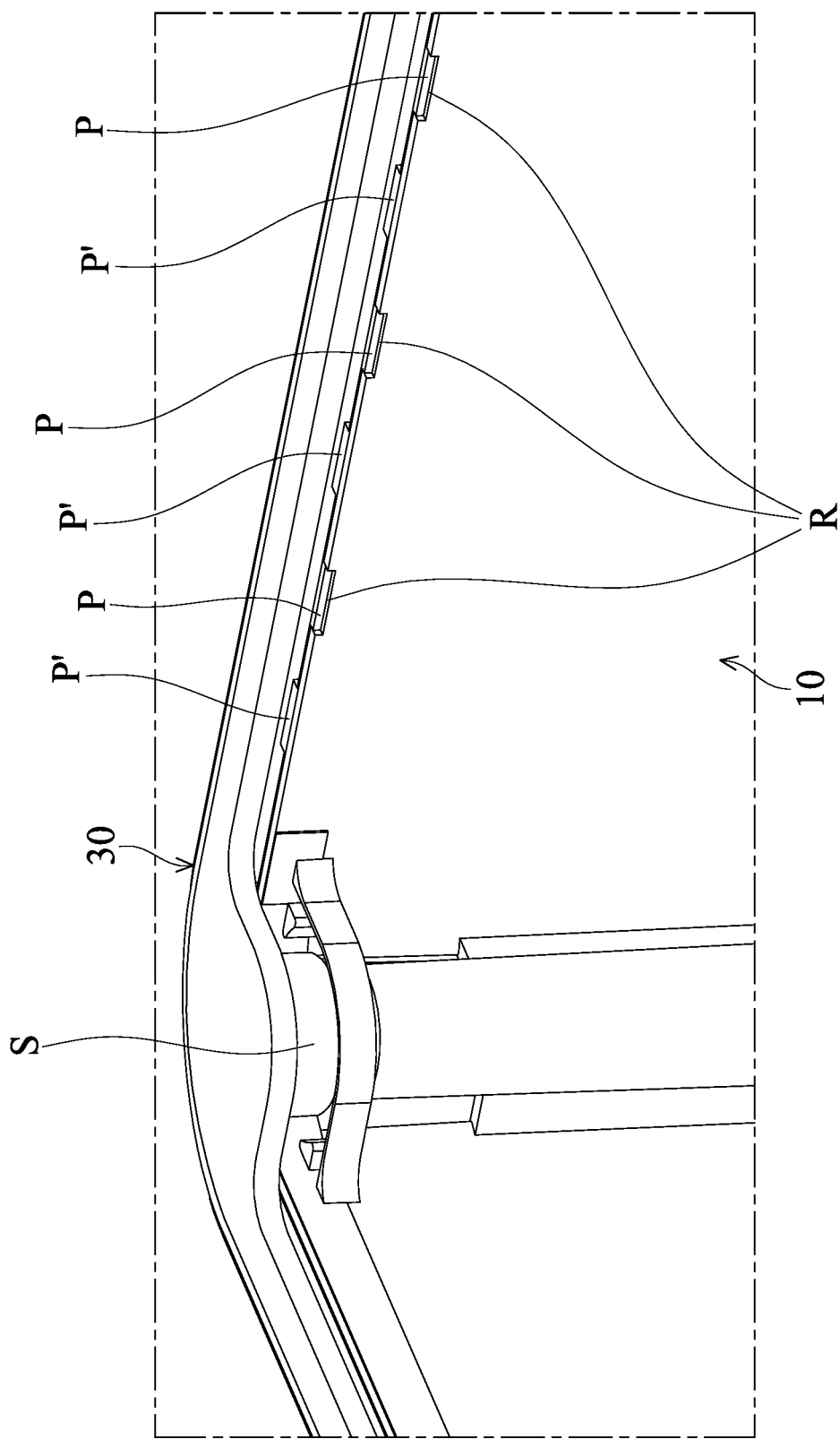
FIG. 9 is a partial enlarged view of the sealing mechanism 100 with the second member 20 omitted therefrom.

FIG. 5 is an enlarged view of the portion A1 in FIG. 3. FIG. 6 is a perspective diagram of the first member 10 in FIG. 1. FIG. 7 is another perspective diagram of the first member 10 in FIG. 1. FIG. 8 is an enlarged view of the portion A2 in FIG. 6. FIG. 9 is a partial enlarged view of the sealing mechanism 100 with the second member 20 omitted therefrom.

Referring to FIGS. 3-9, several protrusions P protrude inwardly from the two extension portions 33 of the sealing element 30. Additionally, several cavities R are formed on the long sides of the first member 10 and face the top side of the sealing mechanism 100. Here, the protrusions P are spaced apart from each other, and the cavities R are also spaced apart from each other.

During the Low Pressure Molding (LPM) process of the sealing element 30, Polyamide (PA) or another thermoplastic material can flow into the cavities R, and the protrusions P is formed after Polyamide (PA) or another thermoplastic material is solidified. Moreover, with the cavities R formed on the first member 10, gas can be exhausted during the Low Pressure Molding (LPM) process, thereby improving the forming quality and the sealing effect of the sealing mechanism 100.

As shown in FIG. 9, the sealing element 30 further forms several protrusions P' extending toward the outer side of the sealing mechanism 100. During the Low Pressure Molding (LPM) process of the sealing element 30, Polyamide (PA) or another thermoplastic material can flow into the cavities (not shown) of the second member 20, and the protrusions P' can be formed after Polyamide (PA) or another thermoplastic material is solidified. Therefore, gas can be exhausted during the Low Pressure Molding (LPM) process, and the forming quality and the sealing effect of the sealing mechanism 100 can be improved.

Figure 10:
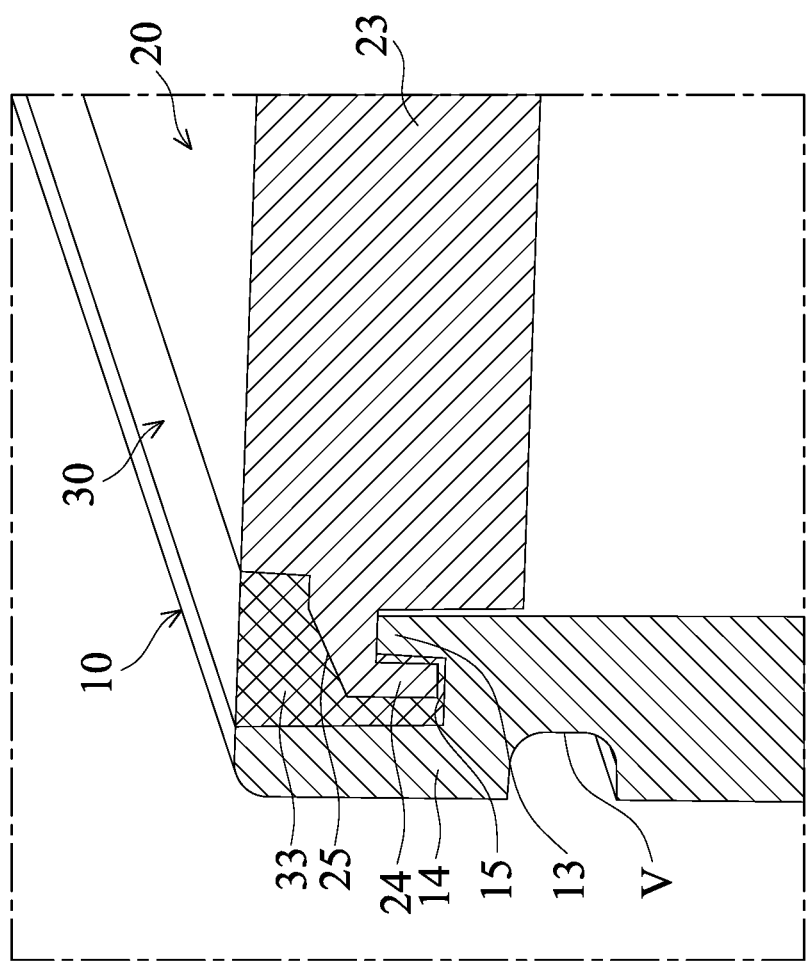
FIG. 10 is a cross-sectional view along line X1-X2 in FIG. 2.

FIG. 10 is a cross-sectional view along line X1-X2 in FIG. 2. As shown in FIGS. 2 and 10, the groove between the first and second members 10 and 20 is located adjacent to the top surface of the second member 20 and surrounds the second member 20. The first member 10 forms an inner wall 13, an outer wall 14, and a recess 15 formed between the inner wall 13 and the outer wall 14. Additionally, the second member 20 has a main body 23 and a hook 24 protruding outwardly from the main body 23, wherein the hook 24 is joined in the recess 15.

In this embodiment, the hook 24 has a slope surface 25 for guiding Polyamide (PA) or another thermoplastic material to flow into the groove between the first and second members 10 and 20 during the Low Pressure Molding (LPM) process, so that the extension portion 33 of the sealing element 30 can be formed (FIG. 10). Moreover, a depressed portion V is formed on the outer surface of the first member 10, whereby the user can easily grip the electronic device (e.g. battery charger or power supply), and the aesthetic appearance of the first member 10 can also be improved.

Figure 11:
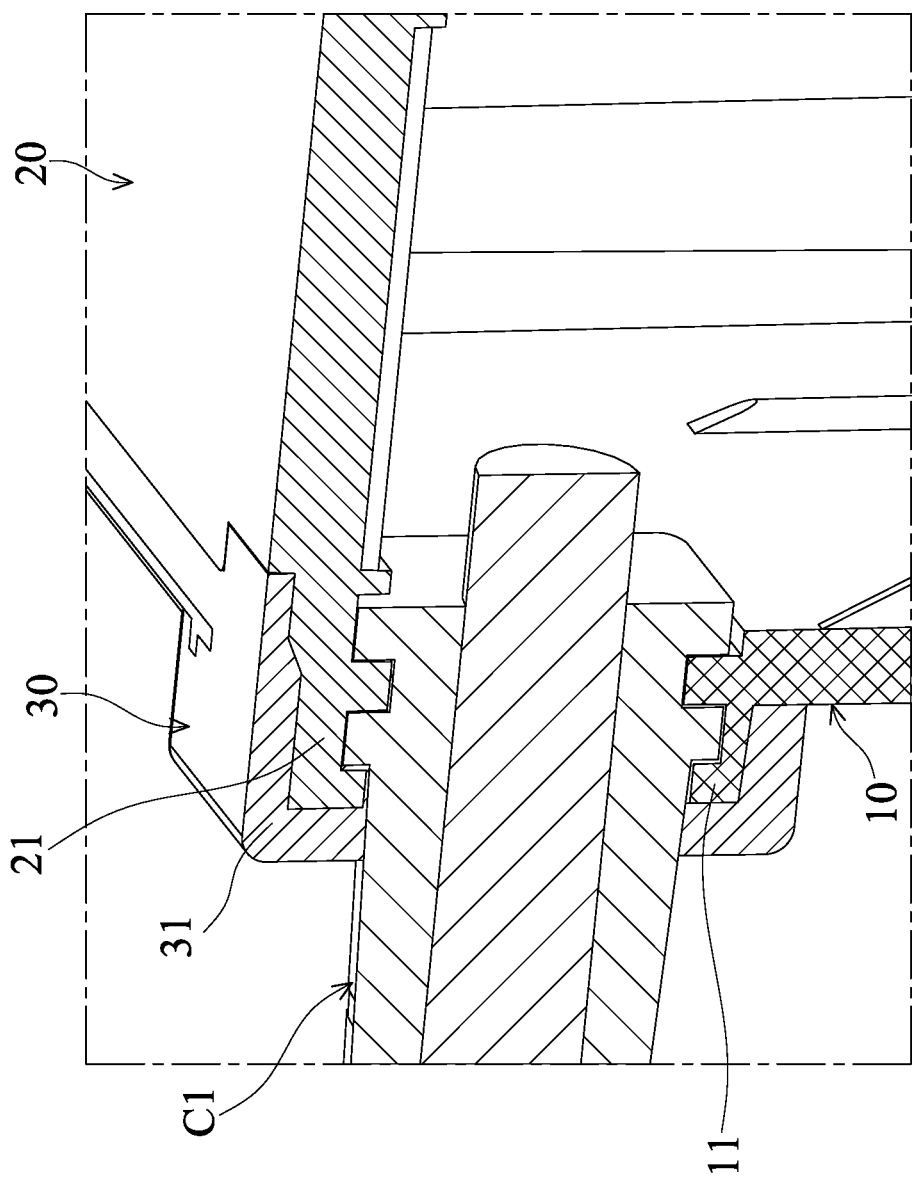
FIG. 11 is a cross-sectional view along line X3-X4 in FIG. 2.

FIG. 11 is a cross-sectional view along line X3-X4 in FIG. 2. As shown in FIGS. 1, 2 and 11, the first engaging portion 11 is formed at an end of the first member 10, and the second engaging portion 21 is formed at an end of the second member 20. Specifically, the first conductive element C1 is clamped between the first engaging portions 11 and 21, and the connection portion 31 of the sealing element 30 surrounds the first conductive element C1 and encompasses the first engaging portions 11 and 21.

Similarly, the second conductive element C2 is clamped between the second engaging portions 12 and 22, and another connection portion 32 of the sealing element 30 surrounds the second conductive element C2 and encompasses the second engaging portions 12 and 22. Thus, the first and second conductive elements C1 and C2 can be firmly joined with the first and second members 10 and 20, so as to prevent water and dust from entering the housing through the gap between the first and second conductive elements C1 and C2 and the first and second members 10 and 20. In some embodiments, the first and second conductive elements C1 and C2 may comprise electrical connecting elements such as conductive wires or connectors.

Figure 12:
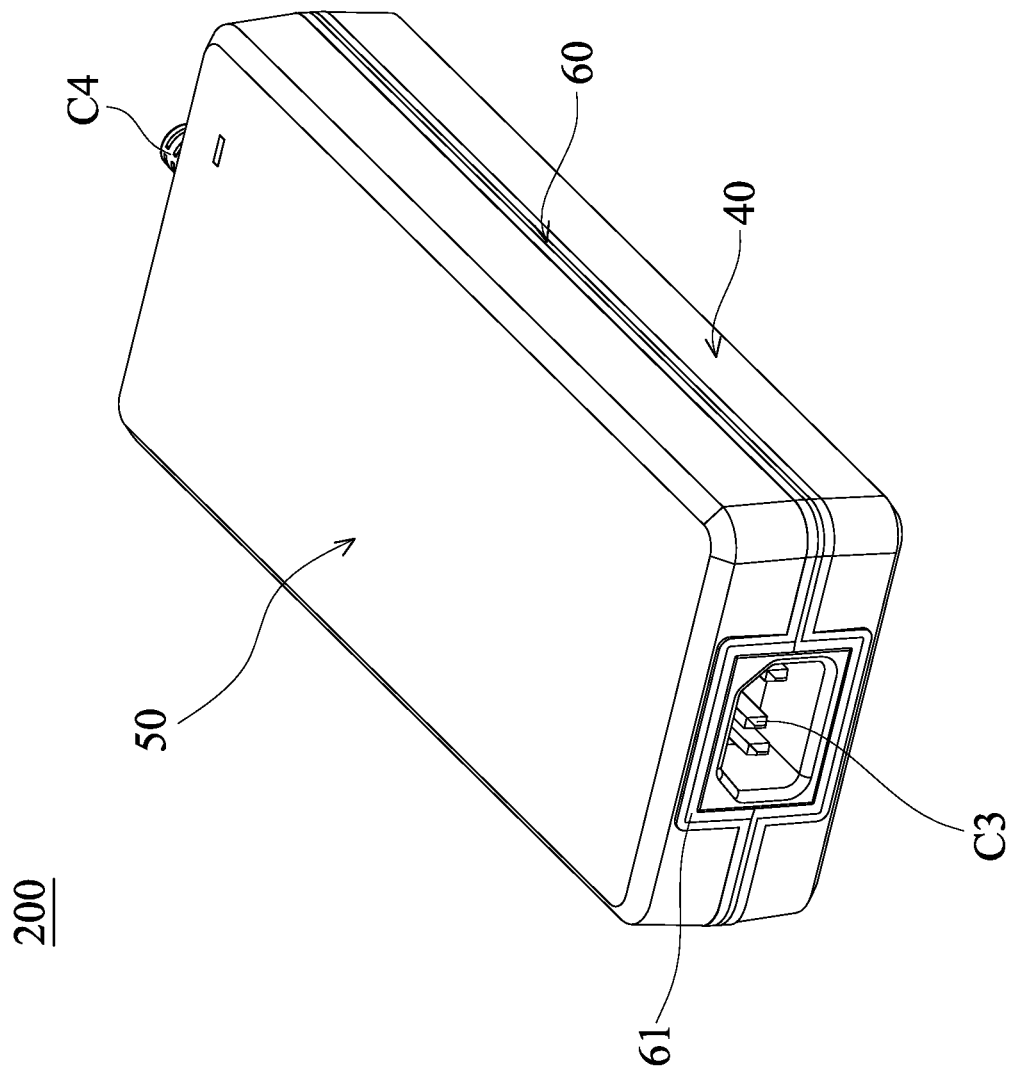
FIG. 12 is a perspective diagram of a sealing mechanism 200 according to another embodiment of the invention.
Figure 13:
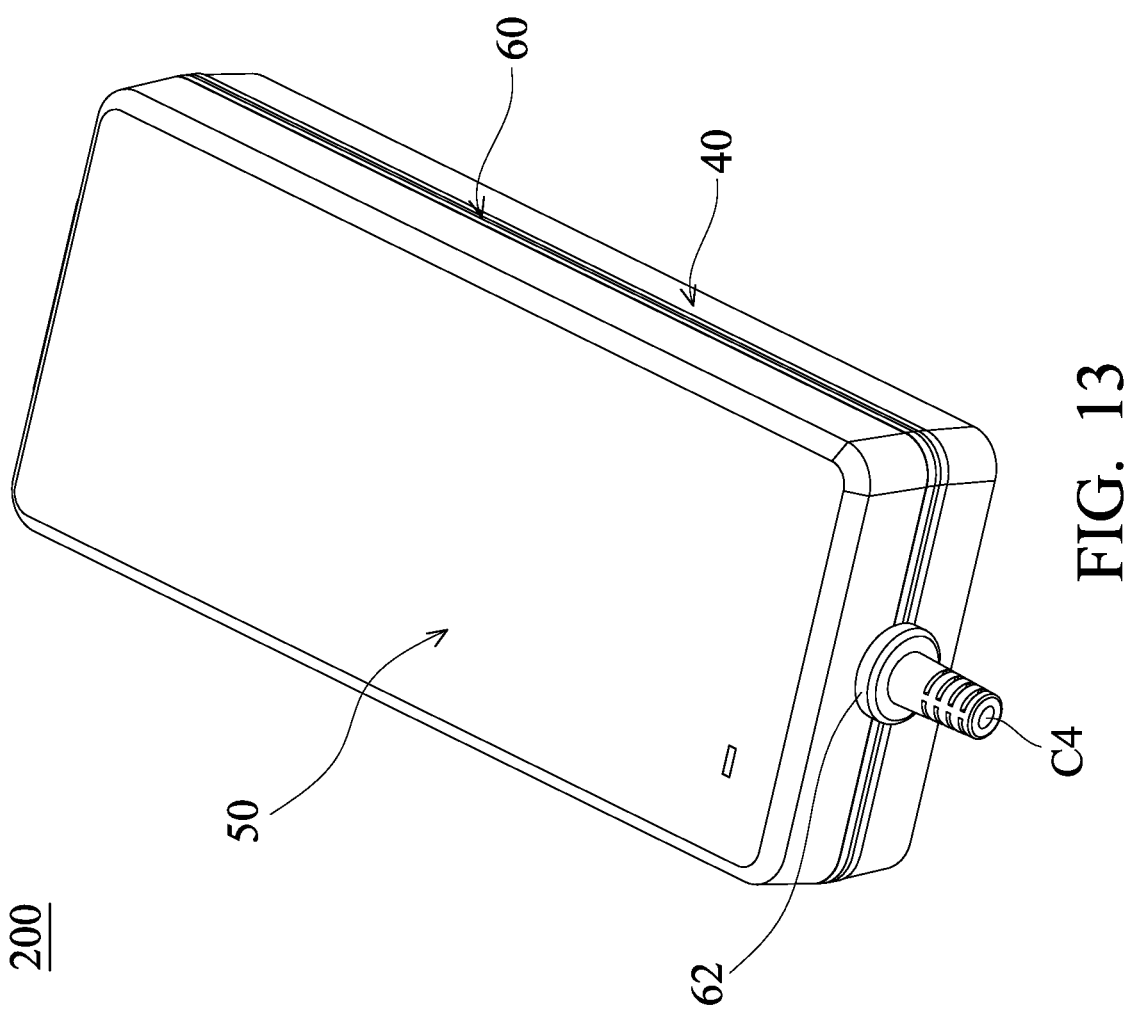
FIG. 13 is another perspective diagram of the sealing mechanism 200 in FIG. 12.
Figure 14:
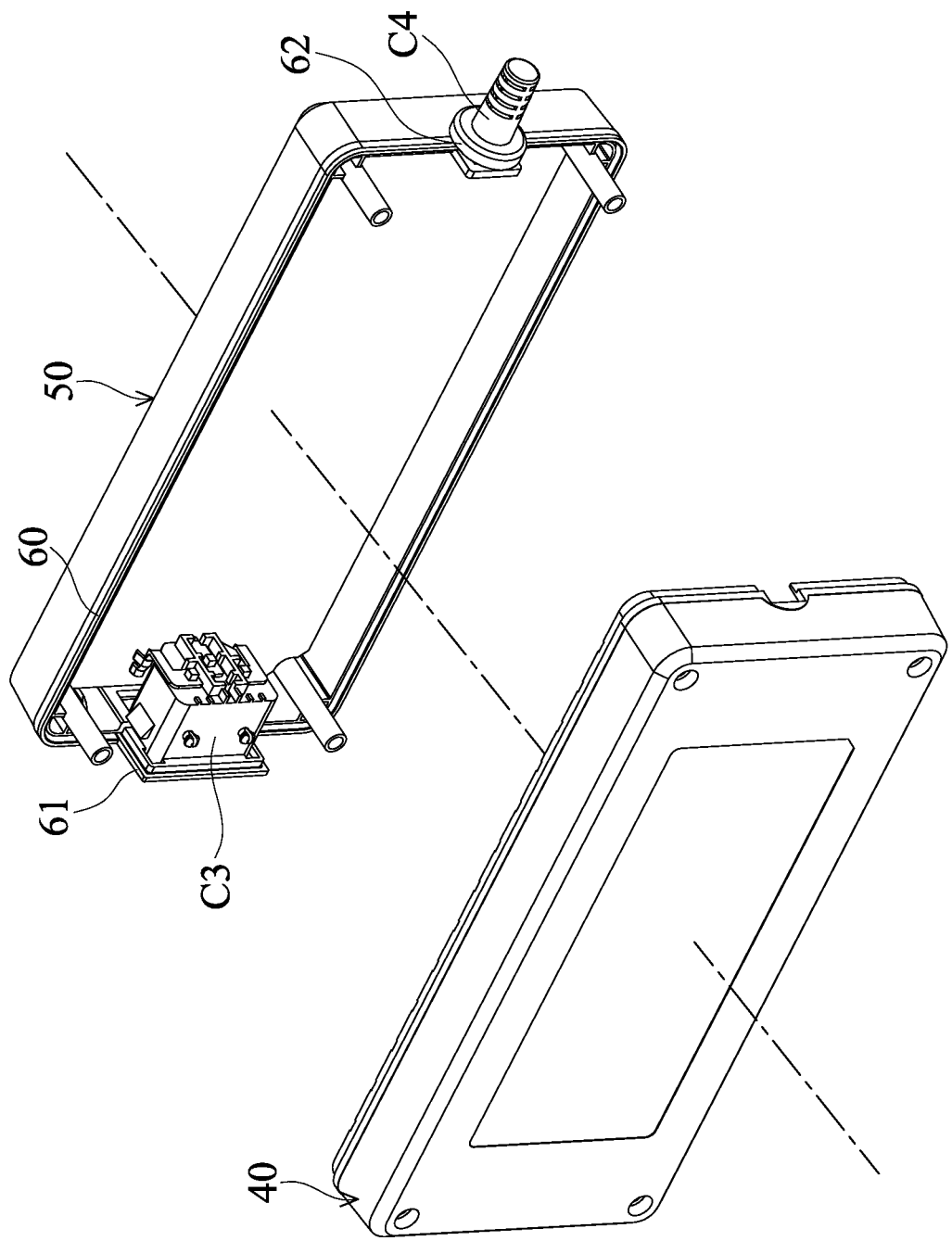
FIG. 14 is an exploded diagram of the sealing mechanism 200 in FIGS. 12 and 13.
Figure 15:
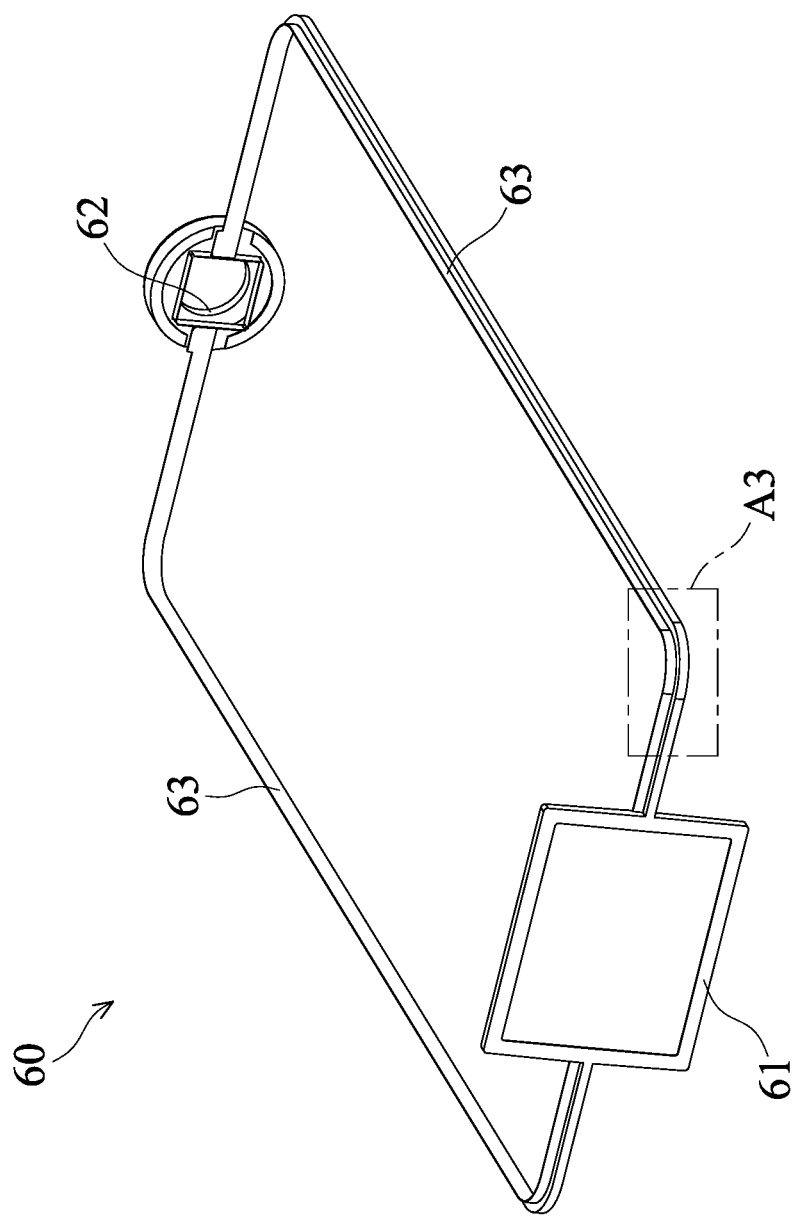
FIG. 15 is a perspective diagram of the sealing element 30 in FIGS. 12, 13 and 14.

FIG. 12 is a perspective diagram of a sealing mechanism 200 according to another embodiment of the invention. FIG. 13 is another perspective diagram of the sealing mechanism 200 in FIG. 12. FIG. 14 is an exploded diagram of the sealing mechanism 200 in FIGS. 12 and 13. FIG. 15 is a perspective diagram of the sealing element 30 in FIGS. 12, 13 and 14.

As shown in FIGS. 12-15, another embodiment of a sealing mechanism 200 can also be used as a housing of an electronic device (e.g. battery charger or power supply). The sealing mechanism 200 primarily comprises a first member 40, a second member 50, and a sealing element 60. The first and second members 40 and 50 may comprise plastic or metal material, and they can be secured to each other as a housing of an electronic device by screws. It should be noted that a groove is formed between the first and second members 40 and 50 after assembly, and the sealing element 60 can be formed in the groove by Low Pressure Molding (LPM), so as to prevent water and dust from entering the housing.

In some embodiments, the sealing element 60 may comprise Polyamide (PA) or another thermoplastic material. During assembly of the sealing mechanism 200, the screws can be inserted through the first member 40 into the second member 50, so that the first and second members 40 and 50 are firmly secured to each other. Subsequently, Polyamide (PA) or another thermoplastic material can be provided in the groove between the first and second members 40 and 50 to form the sealing element 60 by Low Pressure Molding (LPM). As shown in FIGS. 12-15, the sealing element 60 is formed between and surrounds the first and second members 40 and 50, whereby a waterproof seal can be formed between the first and second members 40 and 50.

Still referring to FIGS. 12-15, two conductive elements C3 and C4 (e.g. conductive wires or connectors) are disposed on opposite sides of the sealing mechanism 200, and the sealing element 60 has a substantially rectangular structure. Two connection portions 61 and 62 are formed on the short sides of the sealing element 60, and two longitudinal extension portions 63 are formed on the long sides of the sealing element 60, wherein the extension portions 63 and connection portions 61 and 62 are connected to each other (FIG. 15).

After the sealing element 60 is formed by Low Pressure Molding (LPM), the conductive elements C3 and C4 are respectively surrounded by the two connection portions 61 and 62. Thus, the conductive elements C3 and C4 can be firmly connected to the first and second members 40 and 50, so as to prevent water and dust from entering the housing through the gap between the first and second conductive elements C3 and C4 and the first and second members 40 and 50.

Figure 16:
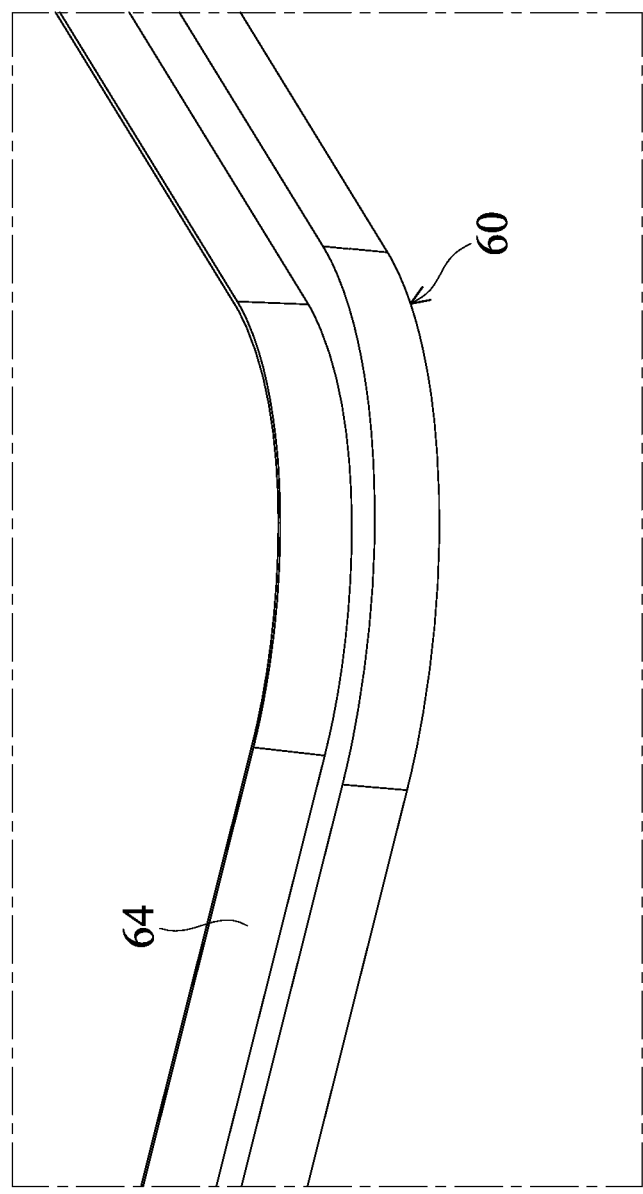
FIG. 16 is an enlarged view of the portion A3 in FIG. 15.
Figure 17:
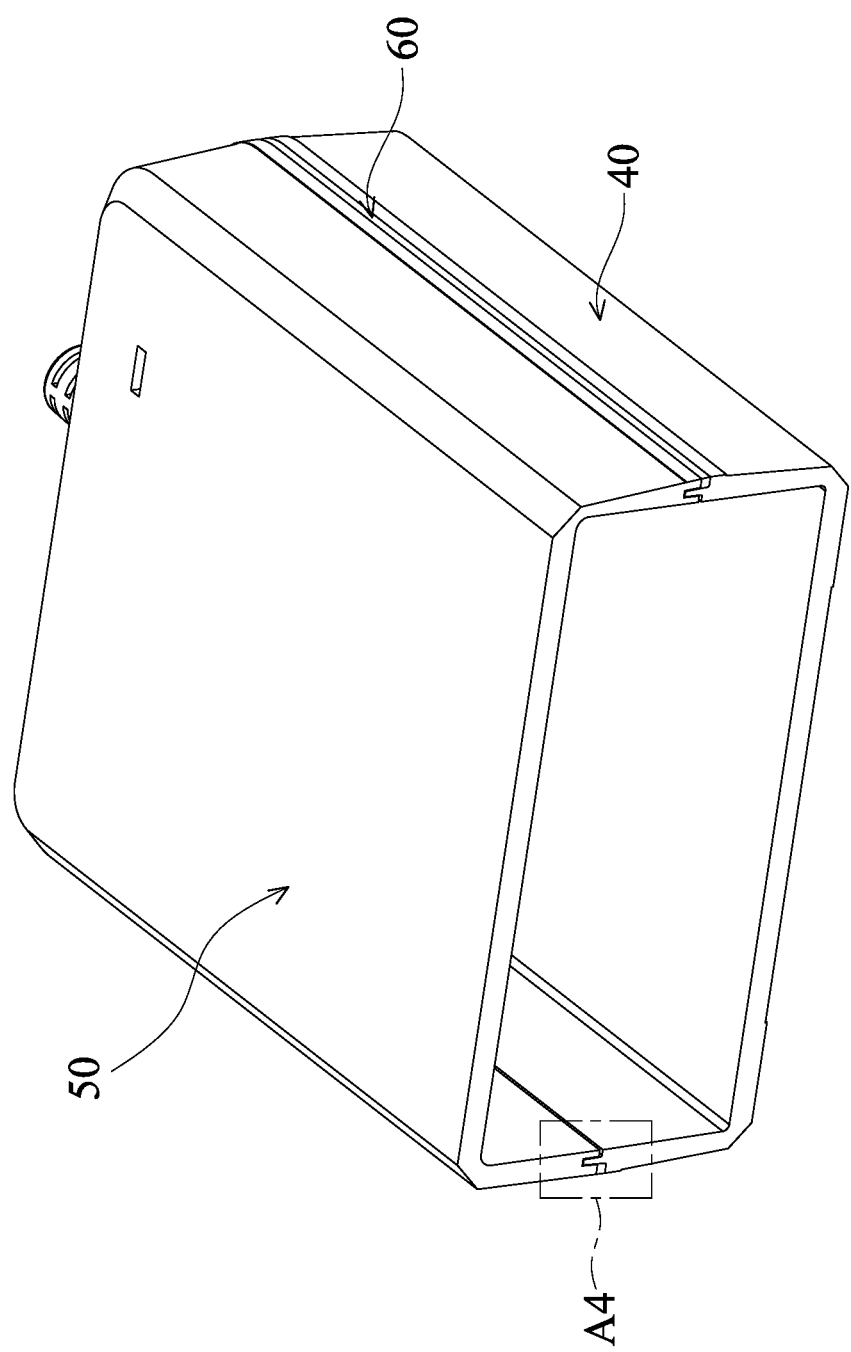
FIG. 17 is a cross-sectional view of the sealing mechanism 200.
Figure 18:
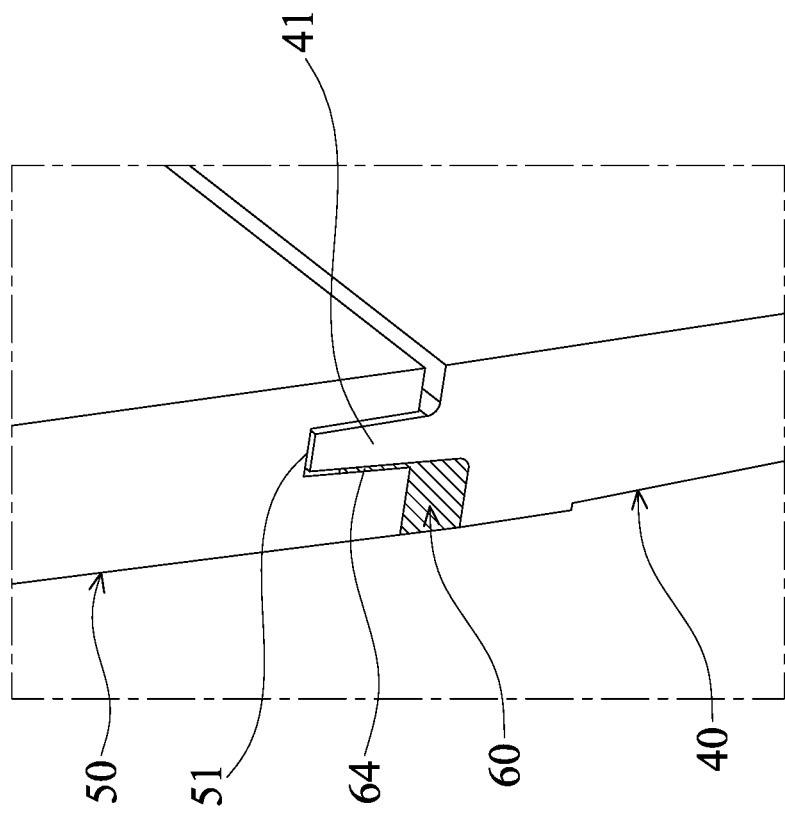
FIG. 18 is an enlarged view of the portion A4 in FIG. 17.

FIG. 16 is an enlarged view of the portion A3 in FIG. 15. FIG. 17 is a cross-sectional view of the sealing mechanism 200. FIG. 18 is an enlarged view of the portion A4 in FIG. 17.

Referring to FIG. 18, the first member 40 forms a rib 41, the second member 50 forms a recess 51, and the rib 41 is joined in the recess 51. Moreover, as shown in FIGS. 16 and 18, the sealing element 60 forms a thin sidewall 64 extending toward the second member 50. During the Low Pressure Molding (LPM) process of the sealing element 60, Polyamide (PA) or another thermoplastic material can flow into the recess 51, and the sidewall 64 of the sealing element 60 can be formed after Polyamide (PA) or another thermoplastic material is solidified. Here, the sidewall 64 is clamped between the rib 41 and the second member 50, so that water and dust can be prevented from entering the housing.

Figure 19:
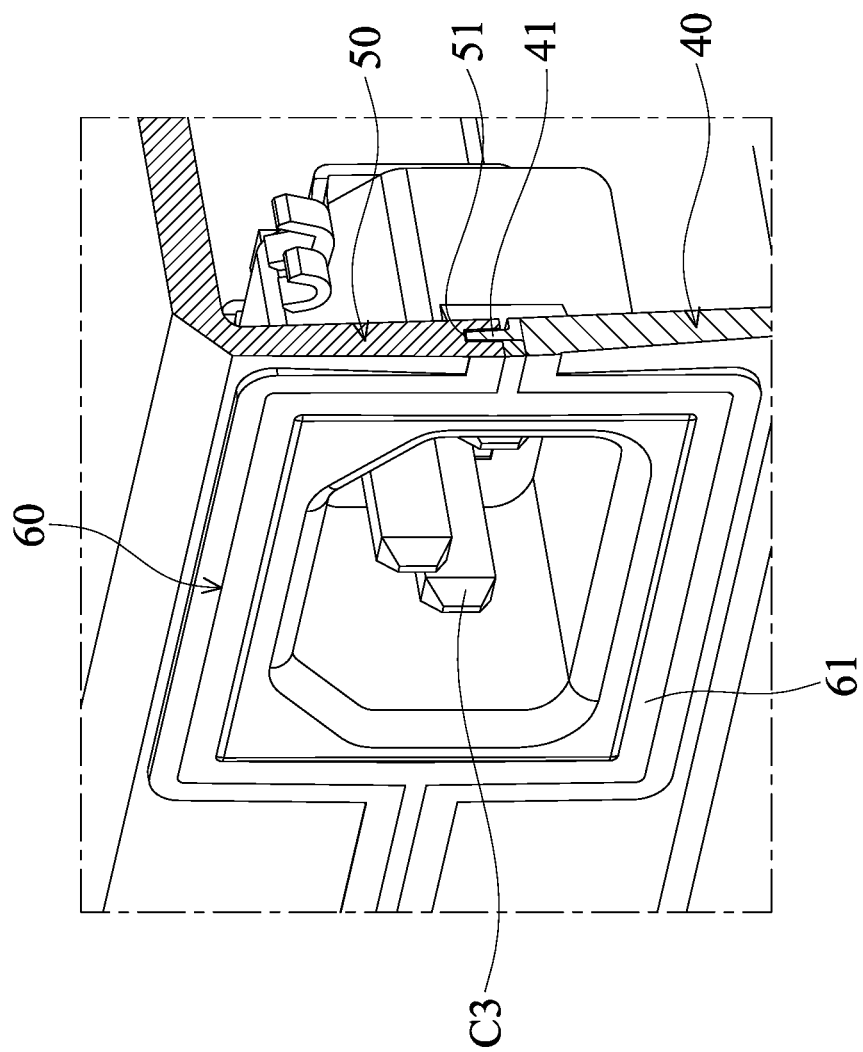
FIGS. 19-21 are enlarged cross-sectional views of the sealing element 60 that is formed in the groove between the first and second members 40 and 50 and that surrounds the conductive element C3.
Figure 20:
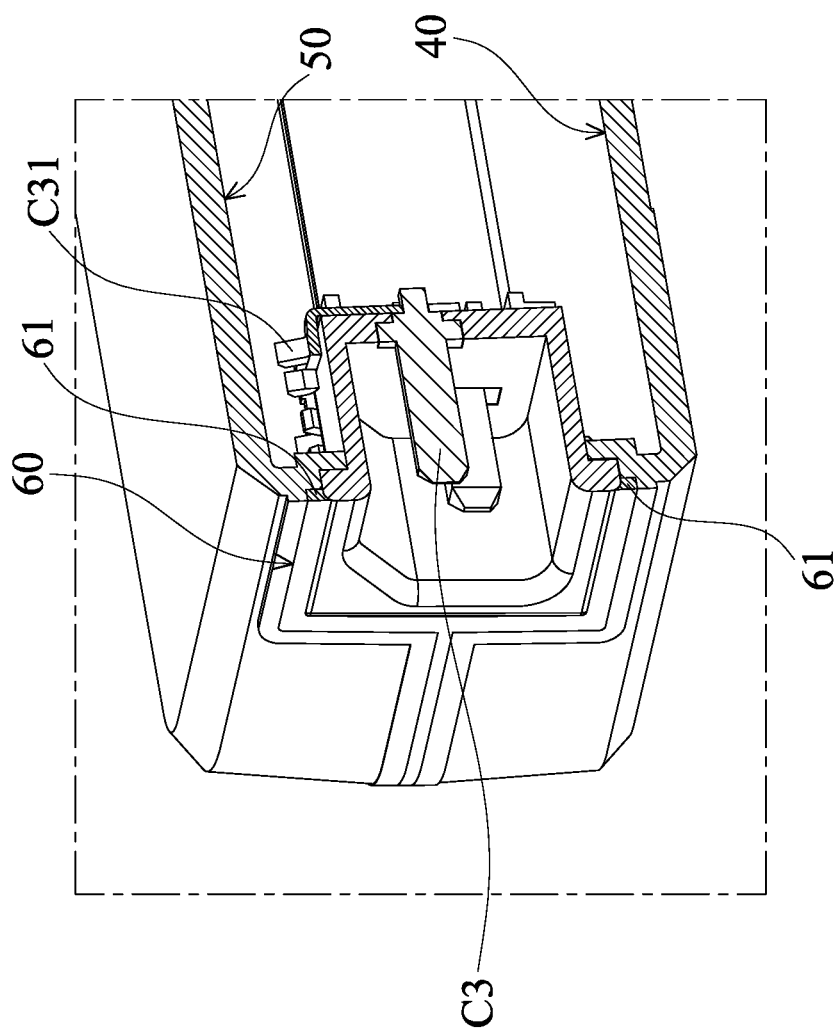
Figure 21:
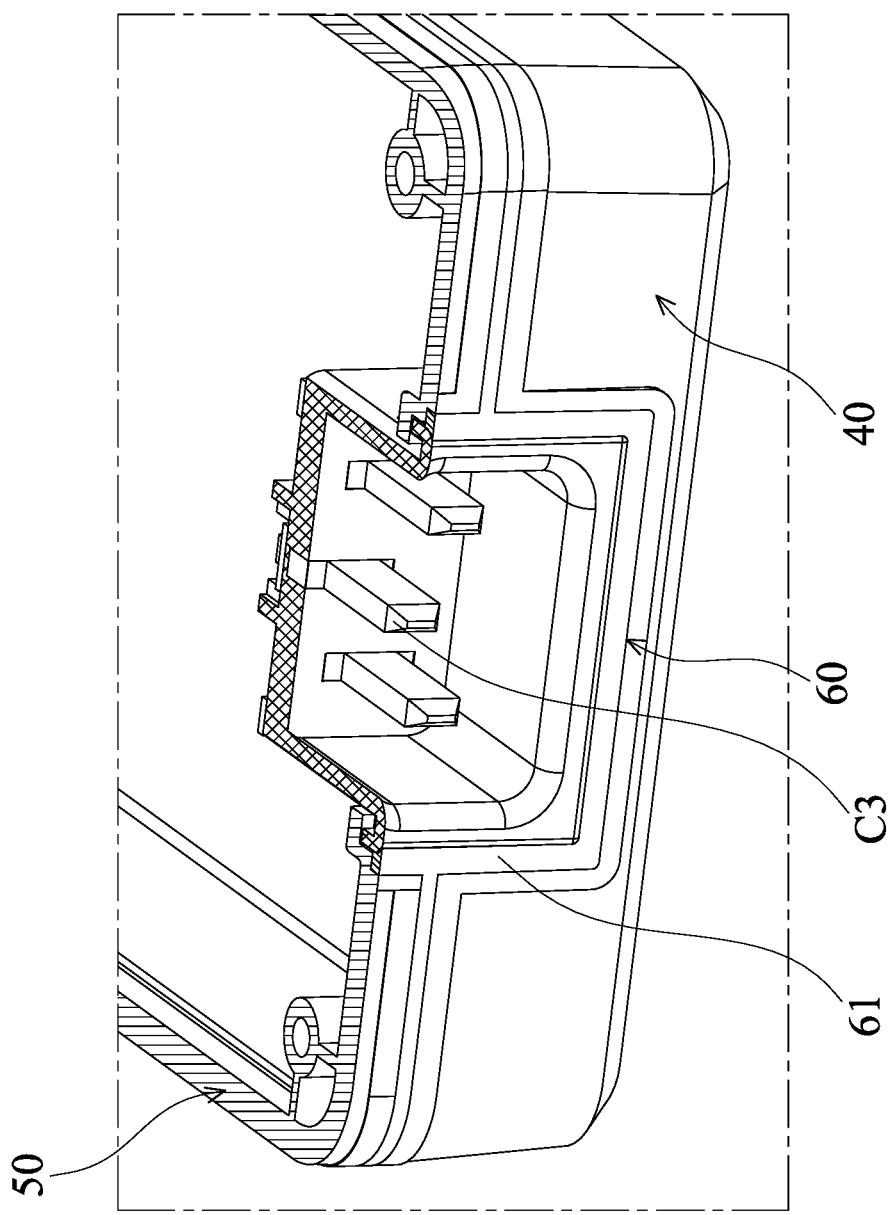

FIGS. 19-21 are enlarged cross-sectional views of the sealing element 60 that is formed in the groove between the first and second members 40 and 50 and surrounds the conductive element C3. Referring to FIGS. 19-21, after the sealing element 60 is formed by Low Pressure Molding (LPM), the conductive element C3 is surrounded and covered by the connection portion 61 of the sealing element 60, so that the conductive element C3 can be firmly connected to the first and second members 40 and 50. Similarly, the conductive element C4 is surrounded and covered by the connection portion 62 of the sealing element 60, so that the conductive element C4 can be firmly connected to the first and second members 40 and 50. Thus, water and dust can be prevented from entering the housing through the gap between the conductive elements C3 and C4 and the first and second members 40 and 50.

In summary, the invention provides a sealing mechanism that comprises a first member, a second member, and a sealing element formed in a groove between the first and second members (e.g. plastic or metal material) by Low Pressure Molding (LPM), so as to prevent water and dust from entering the housing. In some embodiments, the first and second members can be secured to each other by fasteners (e.g. screws). Specifically, Polyamide (PA) or another thermoplastic material can be provided in the groove between the first and second members and to form the sealing element by Low Pressure Molding (LPM). As the fasteners can be concealed by the sealing element, they would not be exposed to the surface of the sealing mechanism, and a waterproof seal can also be formed between the first and second members.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A sealing mechanism, comprising:
 a housing, including a first member and a second member connected to each other, wherein the first member has a first engaging portion, the second member has a second engaging portion, and a conductive element is clamped between the first and second engaging portions;
 a groove, formed between the first and second members; and
 a sealing element, formed in the groove by Low Pressure Molding (LPM), wherein the sealing element is connected between the first and second members and surrounds at least one of the first and second members, and the sealing element has a connection portion that surrounds the conductive element and covers the first and second engaging portions.

2. The sealing mechanism as claimed in claim 1, wherein the first member forms an inner wall, an outer wall, and a recess between the inner wall and the outer wall, and the second member has a hook joined in the recess.

3. The sealing mechanism as claimed in claim 2, wherein the hook has a slope surface.

4. A sealing mechanism, comprising:
- a housing, including a first member and a second member connected to each other;
- a groove, formed between the first and second members; and
- a sealing element, formed in the groove by Low Pressure Molding (LPM), wherein the sealing element is connected between the first and second members and surrounds at least one of the first and second members, and the sealing element forms two connection portions and two extension portions connected to the connection portions, wherein the connection portions respectively surround a conductive element.

5. The sealing mechanism as claimed in claim 1, further comprising a fastener extending through the second member into the first member, wherein the sealing element conceals the fastener.

\* \* \* \* \*